(12) United States Patent
Seo et al.

(10) Patent No.: US 11,588,001 B2
(45) Date of Patent: Feb. 21, 2023

(54) DISPLAY DEVICE HAVING AN ENCAPSULATION LAYER AND POWER LINE IN NON-DISPLAY AREA

(71) Applicant: SAMSUNG DISPLAY CO., LTD., Yongin-si (KR)

(72) Inventors: Seok Hoon Seo, Asan-si (KR); Dong Won Han, Seoul (KR); Seung Woo Seo, Hwaseong-si (KR); Seung Jae Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 595 days.

(21) Appl. No.: 16/550,919

(22) Filed: Aug. 26, 2019

(65) Prior Publication Data

US 2020/0135835 A1    Apr. 30, 2020

(30) Foreign Application Priority Data

Oct. 26, 2018 (KR) .......................... 10-2018-0129142

(51) Int. Cl.
*H01L 27/32* (2006.01)
*H01L 51/52* (2006.01)

(52) U.S. Cl.
CPC ...... *H01L 27/3276* (2013.01); *H01L 51/5237* (2013.01)

(58) Field of Classification Search
CPC .................... H01L 27/3276; H01L 51/5237
See application file for complete search history.

(56) References Cited

U.S. PATENT DOCUMENTS

| | | | |
|---|---|---|---|
| 9,685,626 B2 | 6/2017 | Kim | |
| 9,966,558 B2 | 5/2018 | Kim | |
| 10,326,099 B2 | 6/2019 | Kim | |
| 10,743,425 B2 | 8/2020 | Park et al. | |
| 10,749,137 B2 | 8/2020 | Kim | |
| 11,108,010 B2 | 8/2021 | Kim | |
| 2016/0315284 A1* | 10/2016 | Jeon | .................... H01L 51/5246 |
| 2017/0288007 A1 | 10/2017 | Shin et al. | |
| 2018/0145127 A1* | 5/2018 | Shin | .................... H01L 51/5253 |
| 2018/0145187 A1 | 5/2018 | Voss et al. | |

(Continued)

FOREIGN PATENT DOCUMENTS

| | | |
|---|---|---|
| CN | 108550617 | 9/2018 |
| KR | 10-2012-0077470 | 7/2012 |
| KR | 10-2016-0116240 | 10/2016 |

(Continued)

OTHER PUBLICATIONS

European Search Report dated Mar. 30, 2020 issued in the corresponding European Patent Application No. 19205257.9.

*Primary Examiner* — Lex H Malsawma
(74) *Attorney, Agent, or Firm* — F. Chau & Associates, LLC

(57) ABSTRACT

A display device includes a substrate having a display area and a non-display area. A light emitting element is disposed in the display area. An encapsulation layer is configured to cover the display area and encapsulate the light emitting element. A power line is disposed in the non-display area. A first edge of the encapsulation layer in the non-display area is disposed to coincide with an edge of the power line or is disposed closer to the display area than the edge of the power line.

20 Claims, 8 Drawing Sheets

(56) References Cited

U.S. PATENT DOCUMENTS

2019/0393443 A1* 12/2019 Chen .................. H01L 51/0097
2021/0391555 A1   12/2021 Kim

FOREIGN PATENT DOCUMENTS

| KR | 10-2017-0090382 | 8/2017 |
| KR | 10-2018-0025058 | 3/2018 |
| KR | 10-2018-0048247 | 5/2018 |
| KR | 10-2018-0054385 | 5/2018 |
| KR | 10-2018-0054386 | 5/2018 |
| KR | 10-2018-0068011 | 6/2018 |

* cited by examiner

DISPLAY DEVICE HAVING AN ENCAPSULATION LAYER AND POWER LINE IN NON-DISPLAY AREA

CROSS-REFERENCE TO RELATED APPLICATION

This application claims priority under 35 U.S.C. § 119 to Korean Patent Application No. 10-2018-0129142, filed on Oct. 26, 2018 in the Korean Intellectual Property Office, the disclosure of which is incorporated by reference in its entirety herein.

1. TECHNICAL FIELD

This disclosure relates to a display device, and more particularly to an organic light emitting diode display.

2. DISCUSSION OF RELATED ART

An organic light emitting diode display includes a display panel manufactured by forming light emitting elements and circuit elements on a substrate. The circuit elements are configured to drive the light emitting elements. The display panel may include an encapsulation substrate for preventing penetration of moisture or oxygen from the outside such that the light emitting elements are not damaged by the moisture or oxygen. In recent years, a technique of directly forming an encapsulation layer on the light emitting elements has been developed for reduction of the weight of the display panel and to prevent damage thereto.

Most regions of the display panel may belong to a display area in which a screen is displayed. However, a particular region, such as an edge region of the display panel, may belong to a non-display area where driving circuits, signal lines, and the like are disposed. Typically, the size of the non-display area of the display panel is restricted to improve the screen-to-body ratio of the display device.

SUMMARY

Exemplary embodiments of the present inventive concepts provide a display device with improved reliability while reducing a peripheral area of a display panel.

According to an exemplary embodiment of the present inventive concepts, a display device is provided that includes a substrate having a display area and a non-display area. A light emitting element is disposed in the display area. An encapsulation layer is configured to cover the display area and encapsulate the light emitting element. A power line is disposed in the non-display area. A first edge of the encapsulation layer in the non-display area is disposed to coincide with an edge of the power line or is disposed closer to the display area than the edge of the power line.

According to another exemplary embodiment of the present inventive concepts, a display device is provided that includes a substrate having a display area and a non-display area. A light emitting element is disposed in the display area and includes a first electrode, a second electrode, and an emission layer between the first electrode and the second electrode. An encapsulation layer is configured to cover the display area and to encapsulate the light emitting element. The encapsulation layer includes a first edge being disposed in the non-display area. A power line is disposed in the non-display area. A connecting member is configured to electrically connect the power line and the second electrode. The encapsulation layer contacts the power line or the connecting member in a region where the encapsulation layer overlaps the power line.

DETAILED DESCRIPTION OF THE EXEMPLARY EMBODIMENTS

Figure 1:
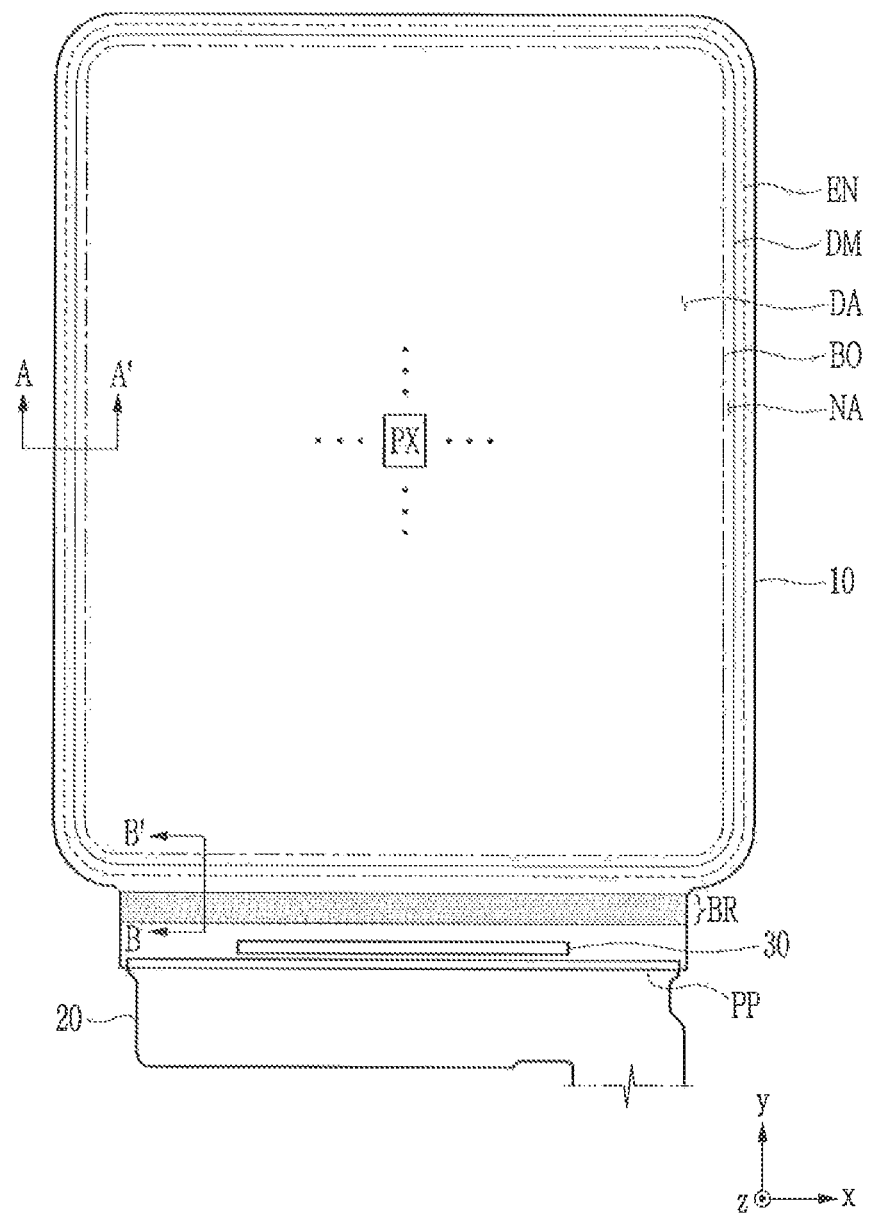
FIG. 1 illustrates a schematic top plan view of a display device according to an exemplary embodiment of the present inventive concepts.

The inventive concept will be described more fully hereinafter with reference to the accompanying drawings, in which exemplary embodiments of the invention are shown. As those skilled in the art would realize, the described embodiments may be modified in various different ways, all without departing from the spirit or scope of the inventive concepts.

To clearly describe exemplary embodiments of the inventive concept, parts that are irrelevant to the description are omitted, and like numerals may refer to like or similar constituent elements throughout the specification.

Further, since sizes and thicknesses of constituent members shown in the accompanying drawings are arbitrarily given for better understanding and ease of description, the inventive concepts are not limited to the illustrated sizes and thicknesses. In the drawings, the thicknesses of layers, films, panels, regions, etc., may be exaggerated for clarity. In the drawings, for improved understanding and ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In the drawings, a reference character x used for indicating a direction is a first direction, reference character y is a second direction perpendicular to the first direction, and a reference character z is a third direction perpendicular to the first direction and the second direction.

A display device according to exemplary embodiments will now be described in detail with reference to the accompanying drawings.

Referring to FIG. 1, the display device may include a display panel 10, a flexible printed circuit film 20 bonded to the display panel 10, and a driving unit including an integrated circuit chip 30, etc.

The display panel 10 may include a display area DA corresponding to a screen on which an image is displayed and a non-display area NA positioned around the display area DA. The display panel 10 may further include signal lines and/or circuits disposed in the display area DA that are configured to generate and/or transfer various signals. For example, in FIG. 1, quadrangle BO corresponds to the border of the display area DA.

Pixels PX are disposed in the display area DA of the display panel 10. For example, the pixels PX may be disposed in a matrix form. Signal lines (not illustrated) such as scan lines (also referred to as gate lines), emission control lines, data lines, and driving voltage lines may be disposed in the display area DA. A scan line, a light emission control line, a data line, and a driving voltage line may be connected to each of the pixels PX. Each pixel PX may be configured to receive a scan signal (also referred to as a gate signal), a light emission control signal, a data signal, and a driving voltage. Each pixel PX may include a light-emitting element, which may be an organic light emitting diode.

The display area DA may include a touch sensor layer that is configured to sense a user's touch or non-contact touch. Although the display area DA is illustratively shown as having a rectangular shape with rounded corners, the display area DA may have various shapes such as a polygonal shape, a circular shape, an elliptical shape or the like.

A pad portion PP which includes pads that are configured to receive signals from the outside of the display panel 10 is disposed in the non-display area NA of the display panel 10. The pad portion PP may be configured to extend in a first direction x along one edge of the display panel 10. The flexible printed circuit film 20 may be bonded to the pad portion PP, and pads of the flexible printed circuit film 20 may be electrically connected to pads of the pad portion PP.

The driving unit may be disposed in the non-display area NA of the display panel 10. The driving unit is configured to generate and/or process various signals for driving the display panel 10. The driving unit may include a data driver that is configured to apply a data signal to the data line, a scan driver configured to apply a scan signal to the scan line, an emission driver that is configured to apply a light emission control signal to the emission control line, and a signal controller that is configured to control the data driver, the scan driver, and the emission driver. The scan driver and the emission driver may be integrated in the display panel 10, and may be disposed at left and right opposite sides or one side of the display area DA. The data driver and the signal controller may be provided as an integrated circuit chip (also referred to as a driving IC chip) 30, and the integrated circuit chip 30 may be mounted in the non-display area NA of the display panel 10. The integrated circuit chip 30 may be mounted on a flexible printed circuit film or the like that may be bonded to the display panel 10, and may be electrically connected to the display panel 10.

The display panel 10 may include an encapsulation layer EN that is configured to entirely cover the display area DA. The encapsulation layer serves to encapsulate the display area DA, particularly the light emitting elements, to prevent water or oxygen from penetrating into the display panel 10. An edge of the encapsulation layer EN may be disposed between an edge of the display panel 10 and the display area DA.

At least one dam DM may be disposed in the non-display area NA. For example, in the embodiment shown in FIG. 2, one dam is disposed in the non-display area NA. The dam DM may prevent a material forming the encapsulation layer EN, particularly an organic material, from overflowing to the outside of the display panel 10.

As shown in FIG. 1, the display panel 10 may include a bending region BR. The bending region BR may be disposed in the non-display area NA between the display area DA and the pad portion PP. The bending region BR may extend across the display panel 10 in the first direction x. The display panel 10 may be configured to bend at a predetermined radius of curvature about a bending axis parallel to the first direction x in the bending region BR. When the display panel 10 is a top emission type, the display panel 10 may be configured to bend such that the pad portion PP and the flexible printed circuit film 20, which are farther from the display area DA than the bending region BR, may be positioned behind the display panel 10. The display panel 10 may be positioned in this configuration in an electronic device to which a display device is applied. The bending region BR may be configured to be bent about one bending axis, or may be bent about two or more bending axes. Although the bending region BR is illustrated as being disposed in the non-display region NA in the exemplary embodiment shown in FIG. 1, the bending region BR may extend over the display area DA and the non-display area NA, or may be disposed in the display area DA.

A cross-sectional structure of the display panel 10 will now be described in detail with reference to FIG. 2 and FIG. 3.

Figure 2:
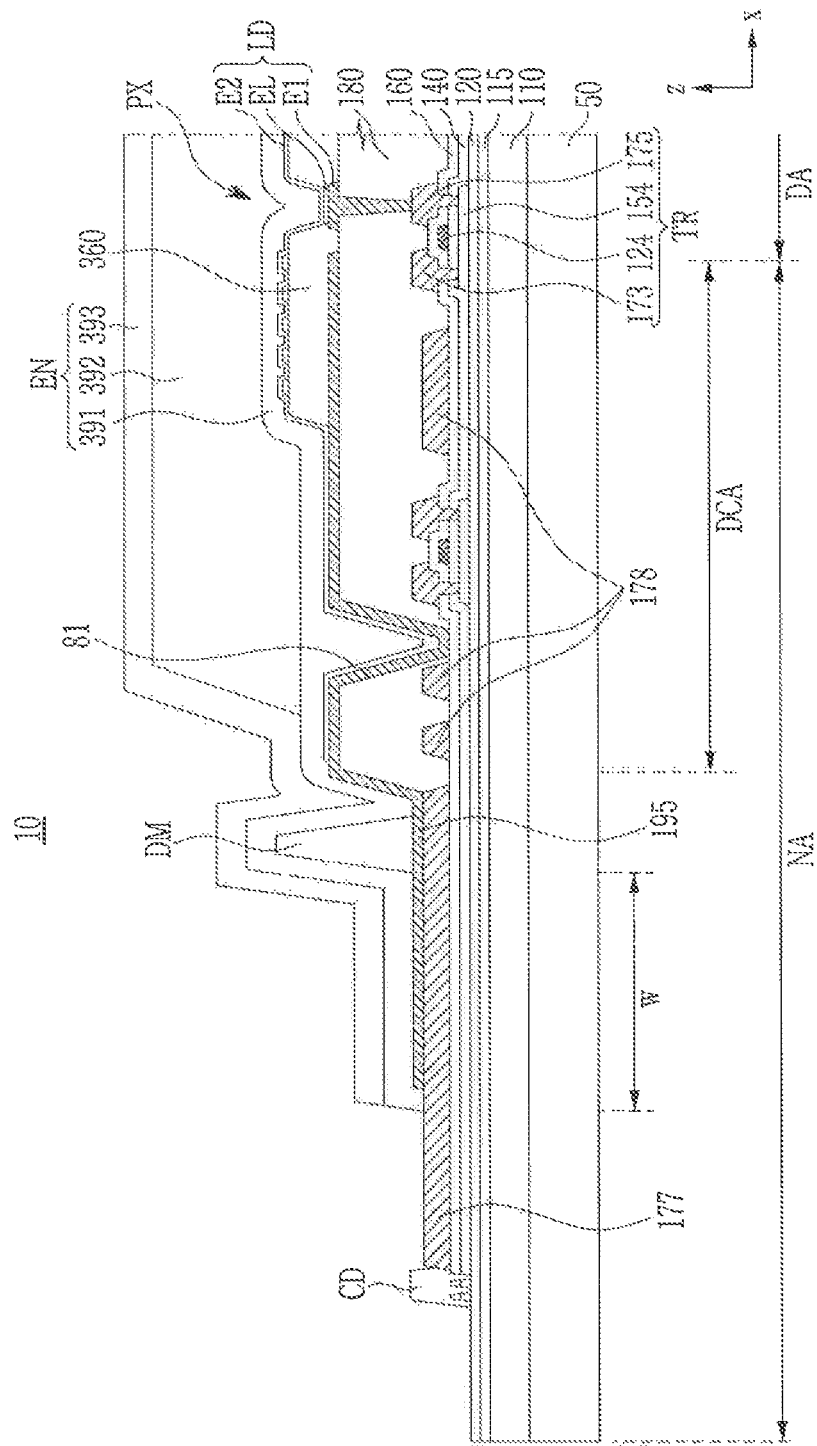
FIG. 2 is a schematic cross-sectional view taken along a line A-A' of FIG. 1 according to an exemplary embodiment of the present inventive concepts.

FIG. 2 shows a cross-sectional view of the display panel near a left edge of the display panel 10 in accordance with an exemplary embodiment. In an exemplary embodiment, a vicinity of a right edge of the display panel 10 may have a cross-sectional structure that is substantially symmetrical with a vicinity of the left edge thereof.

The display panel 10 may include a substrate 110 and various layers, wires, and elements formed thereon. Although a large number of pixels may be arranged in the display area DA of the display panel 10, only one pixel will be briefly illustrated to avoid complication of the drawings to be described. Each pixel PX may include transistors, a capacitor, and a light emitting element. However, a stacked structure of the display panel 10 will be described based on a transistor TR and a light emitting element LD connected thereto.

The substrate 110 may be a flexible substrate. The substrate 110 may be composed of a polymer such as a polyimide, a polyamide, a polycarbonate, or a polyethylene terephthalate. In alternative exemplary embodiments, the substrate 110 may be a rigid substrate made of glass, quartz, ceramic, or the like.

A barrier layer 115 may be disposed on the substrate 110 to prevent moisture from penetrating from the outside. In exemplary embodiments, the barrier layer 115 may include an inorganic insulating material such as a silicon oxide ($SiO_x$), a silicon nitride ($SiN_x$), or the like.

A buffer layer 120 may be disposed on the barrier layer 115. The buffer layer 120 may be configured to block impurities that may diffuse from the substrate 110 to a semiconductor layer 154 and reduce stress applied to the substrate 110 in a process of forming the semiconductor layer 154. The buffer layer 120 may include an inorganic insulating material such as a silicon oxide ($SiO_x$), a silicon nitride ($SiN_x$), or the like.

A semiconductor layer 154 of the transistor TR may be disposed on the buffer layer 120. The semiconductor layer 154 may include a channel region overlapping a gate electrode 124 and source and drain regions disposed at opposite sides thereof to be doped. In exemplary embodiments, the semiconductor layer 154 may include polysilicon, amorphous silicon, or an oxide semiconductor.

A first insulating layer 140 including an inorganic insulating material such as a silicon oxide or a silicon nitride may be disposed on the semiconductor layer 154. The first insulating layer 140 may be referred to as a gate insulating layer.

A gate conductor including the scan line and the gate electrode 124 of the transistor TR may be disposed on the first insulating layer 140. The gate conductor may include a metal such as molybdenum (Mo), copper (Cu), aluminum (Al), silver (Ag), chromium (Cr), tantalum (Ta), or titanium (Ti), or a metal alloy thereof.

A second insulating layer 160 may be disposed on the first insulating layer 140 and the gate conductor. The second insulating layer 160 may include an inorganic insulating material such as a silicon oxide ($SiO_x$), a silicon nitride ($SiN_x$), or the like. The second insulating layer 160 may be referred to as a gate insulating layer.

A data conductor including a data line, a driving voltage line, a power line 177, driving control signal lines 178, and a source electrode 173 and a drain electrode 175 of the transistor TR may be disposed on the second insulating layer 160.

The source electrode 173 and the drain electrode 175 may be connected to the source region and the drain region of the semiconductor layer 154 through contact holes formed in the second insulating layer 160 and the first insulating layer 140, respectively.

The power line 177 may be configured to transfer a predetermined voltage level of power that may be applied to the light emitting element LD of the pixel PX, For example, the power line may transfer a common voltage ELVSS. A first end and a second end of the power line 177 may be electrically connected to the pad portion PP.

The driving signal lines 178 may be configured to transfer signals such as a vertical start signal and a clock signal and signals for providing low voltages of specific levels to the scan driver and/or the light emission driver which may be disposed in a driving circuit region DCA in the non-display area NA. In exemplary embodiments, some of the drive control signal lines 178 may be formed of a same material at a same layer as the gate conductor.

The data conductor may be composed of aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like. The data conductor may have a multilayered structure such as a multilayered structure composed of titanium/aluminum/titanium. (Ti/Al/Ti), titanium/copper/titanium (Ti/Cu/Ti), or molybdenum/aluminum/titanium (Mo/Al/Mo).

The gate electrode 124, the source electrode 173, and the drain electrode 175 constitute a transistor TR together with the semiconductor layer 154. In the exemplary embodiment shown in FIG. 2, the transistor TR includes the gate electrode 124 positioned above the semiconductor layer 154. However, the structure of the transistor may be variously changed without being limited thereto.

A third insulating layer 180 may be disposed on the second insulating layer 160 and the gate conductor. In an exemplary embodiment, the third insulating layer 180 may include an organic insulating material, such as a polyimide, an acryl-based polymer, a siloxane polymer, or the like.

A first electrode E1 of the light emitting element LD may be disposed on the third insulating layer 180. The first electrode E1 may be connected to the drain electrode 175 through a contact hole formed in the third insulating layer 180. A connecting member 195, which is in contact with and is connected to the power line 177, may be disposed on the third insulating layer 180. A portion of the third insulating layer 180, which overlaps the power line 177 may be removed for connection between the third insulating layer 180 and the power line 177.

A valley 81 may be formed in the third insulating layer 180. The connecting member 195 may contact the second insulating layer 160 in the valley 81 of the third insulating layer 180. In this embodiment, a portion of the third insulating layer 180, which is an organic insulating layer that is vulnerable to moisture permeation, may be removed, and this portion thereof may be filled with a material effective in preventing moisture permeation, to block penetration of moisture and outgassing (e.g., outgassing that occurs in the second insulating layer 160 disposed at an outer side than the valley 81).

In an exemplary embodiment, the connecting member 195, which is a conductive layer, may be formed of a same material by a same process as those of the first electrode E1. For example, the first electrode E1 and the connecting member 195 may be composed of a metal such as silver (Ag), nickel (Ni), gold (Au), platinum (Pt), aluminum (Al), copper (Cu), aluminum neodymium (AlNd), aluminum nickel lanthanum (AlNiLa), or a metal alloy thereof. The first electrode E1 and the connecting member 195 may include a transparent conductive material such as an indium tin oxide (ITO) or an indium zinc oxide (IZO). The first electrode E1 and the connecting member 195 may have a multilayered structure, such as a multilayered structure composed of ITO/silver (Ag)/ITO or ITO/aluminum (Al).

A fourth insulating layer 360 may have an opening overlapping the first electrode E1 The fourth insulating layer 360 may be disposed on the third insulating layer 180. An opening of the fourth insulating layer 360 may define each pixel area, and may be referred to as a pixel definition layer. The fourth insulating layer 360 may include an organic insulating material.

An emission layer EL may be disposed on the first electrode E1. A second electrode E2 may be disposed on the emission layer EL. The second electrode E2 may be connected with the connecting member 195. Since the connecting, member 195 is connected to the power line 177, the second electrode E2 may be electrically connected to the power line 177 through the connecting member 195. Accordingly, when the power line 177 transfers a common voltage ELVSS as the power voltage, the second electrode E2 may receive the common voltage ELVSS. The second electrode E2 may be composed of a low work function metal. For example, the second electrode E2 may be composed of a thin layer of calcium (Ca), barium (Ba), magnesium (Mg), aluminum (Al), and silver (Ag) to have light transmittance. The second electrode E2 may be formed of a transparent conductive material such as ITO or IZO.

The first electrode E1, the emission layer EL, and the second electrode E2 of each pixel may constitute a light emitting element LD, such as an organic light emitting diode.

An encapsulation layer EN may be disposed on the second electrode E2. The encapsulation layer EN is configured to encapsulate the light emitting element LD to prevent moisture or oxygen from penetrating from the outside. In an exemplary embodiment, the encapsulation layer EN may entirely cover the display area, and an edge of the encapsulation layer EN may be disposed in the non-display area NA.

The encapsulation layer EN may include at least one inorganic layer and at least one organic layer that are stacked. In the illustrated embodiment, the encapsulation layer EN is a thin film encapsulation layer including a first inorganic layer 391, an organic layer 392, and a second inorganic layer 393. In the encapsulation layer EN, the first inorganic layer 391 and the second inorganic layer 393 are configured to prevent penetration of water. The organic layer 392 is configured to planarize a snake of the encapsulation layer EN, particularly a surface of the second inorganic layer 393 in the display area DA. The first inorganic layer 391 and the second inorganic layer 393 may include an inorganic insulating material such as a silicon oxide (SiO$_x$), a silicon nitride (SiN$_x$), and the like. The organic layer 392 may include an organic material such as an acrylic resin, a methacrylic resin, a polyisoprene, a vinyl resin, an epoxy resin, a urethane resin, a cellulose resin, and a perylene resin.

In an exemplary embodiment, the first inorganic layer 391 and the second inorganic layer 393 may be formed to extend wider across the substrate than the organic layer 392. The first inorganic layer 391 and the second inorganic layer 393 may contact each other in a vicinity of an edge of the encapsulation layer. For example, the first inorganic layer and second inorganic layer may contact each other in a region that overlaps the power line 177. In one exemplary embodiment, an edge of the first inorganic layer 391 and an edge of the second inorganic layer 393 may substantially coincide with each other. As such, the first inorganic layer 391 and second inorganic layer 393 may be widely formed to prevent moisture or oxygen from penetrating from a side surface of the display area DA, and to delay the penetration by making a penetration path for moisture or oxygen long and complicated.

Edges of the first inorganic layer 391 and the second inorganic layer 393 may be disposed on the power line 177 to overlap the power line. The overlapping first inorganic layer 391 and second inorganic layer 393 cover a portion of the power line 177. The edges of the first inorganic layer 391 and the second inorganic layer 393 may be disposed closer to the display area DA than an outer edge of the power line 177 (e.g., the edge of the power line which is farther from the display area DA).

When the encapsulation layer EN is formed such that the edges of the first inorganic layer 391 and the second inorganic layer 393 are positioned to contact each other in the general vicinity of an edge of the encapsulation layer as described above, the size of the non-display area NA is not increased by the formation of the encapsulation layer EN. Accordingly, it is possible to reduce a width of the non-display area NA or increase the formation and design margin of the wires or elements disposed in the non-display area NA. For example, it is possible to reduce the width of the non-display area NA, and to increase the screen-to-body ratio of the display device as compared to devices in which the first inorganic layer 391 and the second inorganic layer 393 completely cover the power line 177. Alternatively, the width of the power line 177 may be increased instead of reducing the width of the non-display area NA. In this embodiment, the resistance of the power line 177 may be reduced to improve the power efficiency.

When the width w of the portion of the first inorganic layer 391 that contacts the power line 177 or the connecting member 195 is equal to or larger than a predetermined value, even if the formation area of the encapsulation layer EN is reduced, the encapsulation layer EN may still be effective in preventing the penetration of moisture or oxygen. For example, in an exemplary embodiment, it was determined in a 500 hour reliability evaluation of an unbiased highly accelerated stress test (UHAST) that the encapsulation layer effectively prevented the penetration of moisture or oxygen when the width w of the portion of the first inorganic layer that contacts the power line or the connecting member was equal to or greater than about 82.53 μm.

The first inorganic layer 391 may be disposed directly above the connecting member 195 or the power line 177. Accordingly, a lower surface of the first inorganic layer 391 may contact the connecting member 195 or contact the power line 177. The first inorganic layer 391 may contact the edge of the connecting member 195, including a side surface of the edge of the connecting member. In the exemplary embodiment shown in FIG. 2, the first inorganic layer 391 covers an edge of the connecting member 195 with the second inorganic layer 393, and an edge of the first inorganic layer 391 contacts the power line 177. However, the edge of the connecting member 195 in the non-display area NA may not be covered by the first inorganic layer 391 and may substantially coincide with the edge of the first inorganic layer 391. Alternatively, the edge of the connecting member 195 in the non-display area NA may be farther away from the display area DA than the edge of the first inorganic layer 391. In this embodiment, even when the first inorganic layer 391 overlaps the power line 177, it may not contact the power line 177.

A polarization layer for reducing external light reflection may be disposed on the encapsulation layer EN. A touch sensor layer including touch electrodes for sensing a touch may be disposed between the encapsulation layer EN and the polarization layer.

The dam DM may be disposed on the second insulating layer 160 in the non-display area NA. The dam DM may serve to prevent an organic material such as a monomer from overflowing when the organic layer 392 of the encapsulation layer EN is formed. Therefore, an edge of the organic layer 392 of the encapsulation layer EN may be substantially disposed between the dam DM and the display area DA. The first inorganic layer 391 and the second inorganic layer 393 of the encapsulation layer EN may be configured to extend over the dam DM to cover the dam DM. In this case, adhesion between the first inorganic layer 391 and the second inorganic layer 393 may increase due to the increased contact area of the first inorganic layer 391 and the second inorganic layer 393.

The dam DM may include at least one layer. The dam DM may be formed by using an insulating layer formed in the display area DA. For example, when the dam DM is formed as a single layer, the dam DM may be formed of the same material by the same process as the fourth insulating layer 360. In other exemplary embodiments, the dam DM may be formed of the same material by the same process as the second insulating layer 160. In an exemplary embodiment, when the dam DM is formed as a multilayer, a lower layer thereof may be formed of the same material by the same process as the second insulating layer 160, and an upper layer thereof may be formed of the same material by the same process as the fourth insulating layer 360. As shown in FIG. 2, the lower surface of the dam DM may contact the connecting member 195 in a region.

A protection layer 50 for protecting the display panel 10 may be disposed below the display panel 10. The protection layer 50 may be attached to a rear surface of the display panel 10, such as by an adhesive. The protection layer 50 may be composed of a plastic such as a polyethylene terephthalate, a polyethylene naphthalate, a polyimide, or a polyethylene sulfide.

A crack dam CD may be disposed between the power line 177 and an edge of the substrate 110 in the non-display area NA. The crack dam CD is configured to prevent crack propagation in inorganic insulating layers such as the barrier layer 115 and the buffer layer 120 when the display panel 10 is cut to correspond to the edge of the substrate 110, for example. The crack dam CD may be formed of an organic material. For example, in an exemplary embodiment, the crack dam CD may be formed of the same material by the same process as those of the second insulating layer 160 or the same material by the same process as those of the fourth insulating layer 360.

The first insulating layer 140 and the second insulating layer 160 may be formed such that the edges in the non-display region NA are disposed inside the edge of the substrate 110 (e.g., closer to the display area DA than the edge of the substrate in the non-display region). The crack dam CD may be formed to cover the edges of the first and second insulating layers 140 and 160 in the non-display region NA. A slit may be formed in regions of the first insulating layer 140 and the second insulating layer 160, which overlap the crack dam CD. The first insulating layer 140 and the second insulating layer may be formed discontinuously due to the slit, thereby increasing the crack propagation preventing ability of the crack dam CD. The slit may be formed only in the second insulating layer 160. However, in some exemplary embodiments, the slit may not be formed in the crack dam CD. The crack dam CD may be formed so as to not overlap the first insulating layer 140 and/or the second insulating layer 160.

In an exemplary embodiment, the crack dam CD may be configured to cover at least a portion of the side surface of the power line 177. In this embodiment, the crack dam CD prevents foreign particles from sticking to the side surface of the power line 177 or corrosion of the side surface of the power line 177. For example, when the power line 177 is a multilayer structure, such as a multilayered structure comprising titanium/aluminum/titanium (Ti/Al/Ti), an aluminum layer is etched more than a titanium layer during etching for forming the power line 177 so that the power line 177 with an edge side surface that is recessed may be formed. Material, such as metal particles, etc. may be trapped in the recessed side surface in a subsequent process, resulting in unintentional stepping. When the crack dam CD is configured to cover the side surface of the edge of the power line 177, the crack dam CD fills such a groove and prevents unintentional stepping.

Figure 3:
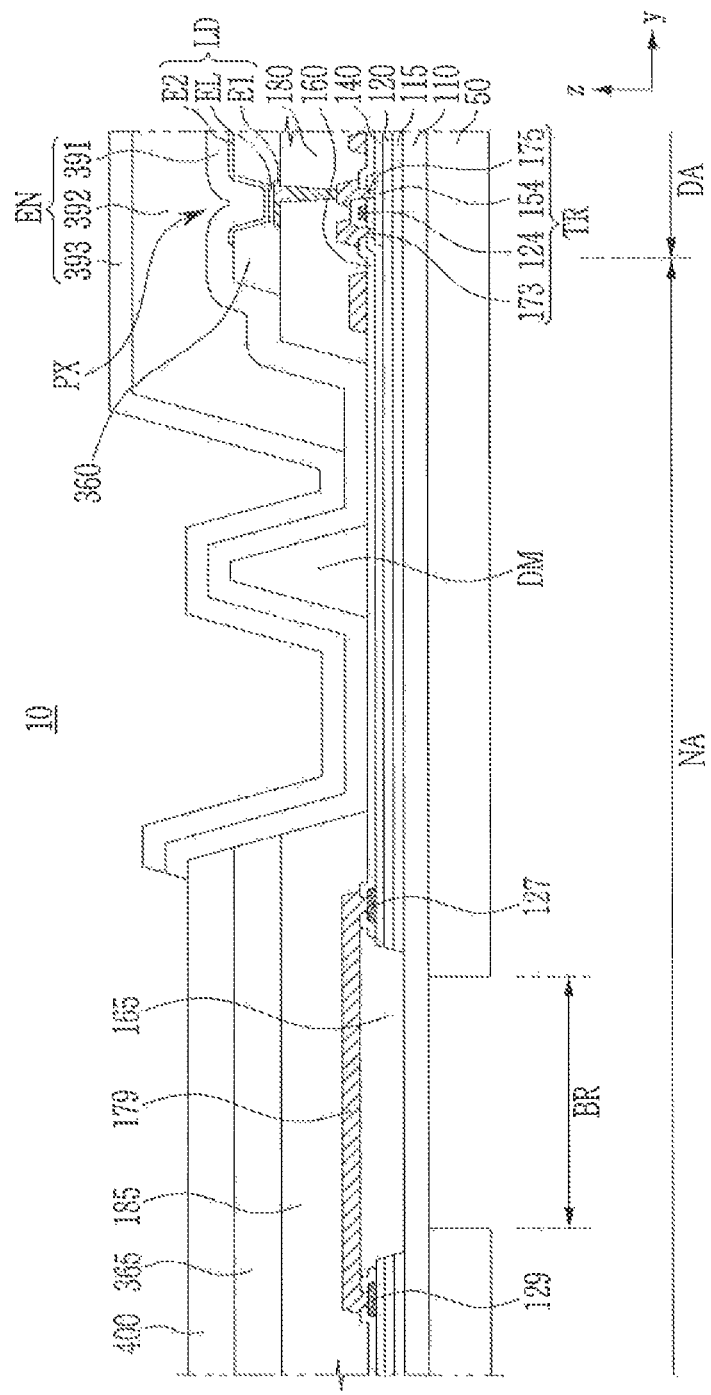
FIG. 3 is a schematic cross-sectional view taken along a line B-B' of FIG. 1 according to an exemplary embodiment of the present inventive concepts.

In FIG. 3, an exemplary embodiment of a cross-section of an edge of the display panel 10 where the pad portion PP is disposed is illustrated. As illustrated in FIG. 1, since the dam DM surrounds the display area DA, the dam DM may be spaced apart from the portion of the display panel 10 where the pad portion PP is disposed referring to FIG. 3. The power line 177 illustrated in FIG. 2 may not be disposed in the lower edge of the display panel 10. Therefore, the connecting member 195 electrically connecting the power line 177 and the second electrode E2 may not be overlapped or contacted by the dam DM. The dam DM may be disposed directly above the second insulating layer 160, and a lower surface of the dam DM may contact the second insulating layer. The first inorganic layer 391 and the second inorganic layer 393 of the encapsulation layer EN may be formed to cover the dam DM.

The bending region BR of exemplary embodiments of the display device shown in FIG. 3 will now be described. A connecting wire 179 is disposed in the bending region BR. The bending wire is configured to electrically connect a first wire 127 and a second wire 129 which are disposed at opposite sides thereof, respectively. Accordingly, a signal (e.g., a data signal, a control signal, or a voltage signal) outputted from the integrated circuit chip 30, a signal (e.g., a driving voltage ELVDD or a common voltage ELVSS) inputted into the pad portion PP, etc. may be transferred to the display area DA, the driver, etc. through the second wire 129, the connecting wire 179, and the first wire 127. Since the connection wire 179 is configured to bend when the bending region BR is bent, the connecting wire 179 may be formed of a metal having good flexibility and a small Young's modulus, in an exemplary embodiment, the connecting wire 179 may be formed of a same material in a same process as those of the source electrode 173 and the drain electrode 175. Increased flexibility of the connecting wire 179 may reduce the risk of deterioration (for example, cracking) or disconnection of the connecting wire 179 during bending.

A first protection layer 165 may be disposed between the substrate 110 and the connecting wire 179 in the bending region BR. The first protection layer 165 may include an organic insulating material such as a polyimide, an acryl-based polymer, or a siloxane-based polymer. A second protection layer 185 and a third protection layer 365 may be disposed on the connection wire 179. In an exemplary embodiment, the second protection layer 185 may be formed of a same material in a same process as those of the third insulating layer 180. In an exemplary embodiment, the third protection layer 365 may be formed of a same material in a same process as those of the fourth insulating layer 360. A bending protection layer 400 may be disposed on the third protection layer 365. The bending protection layer 400 is configured to release a tensile stress and to protect the connecting wire 179. The bending protection layer 400 may be referred to as a stress neutralization layer. In an exemplary embodiment, the bending protection layer 400 may include an organic insulating material such as an acryl resin.

The barrier layer 115, the buffer layer 120, the first insulating layer 140, and the second insulating layer 160, which are inorganic insulating layers including inorganic insulating materials, may be removed in the bending region BR. The inorganic insulating layers are vulnerable to cracks during bending, and the cracks may damage the wires.

The protection layer 50 may be configured to entirely cover the rear surface of the display panel 10, but may not be disposed in the bending region BR to reduce a bending stress of the bending region BR and reduce a curvature radius during bending.

Hereinafter, some exemplary embodiments will be described with reference to FIG. 4 to FIG. 8, focusing on differences from the above-mentioned embodiment.

Figure 4:
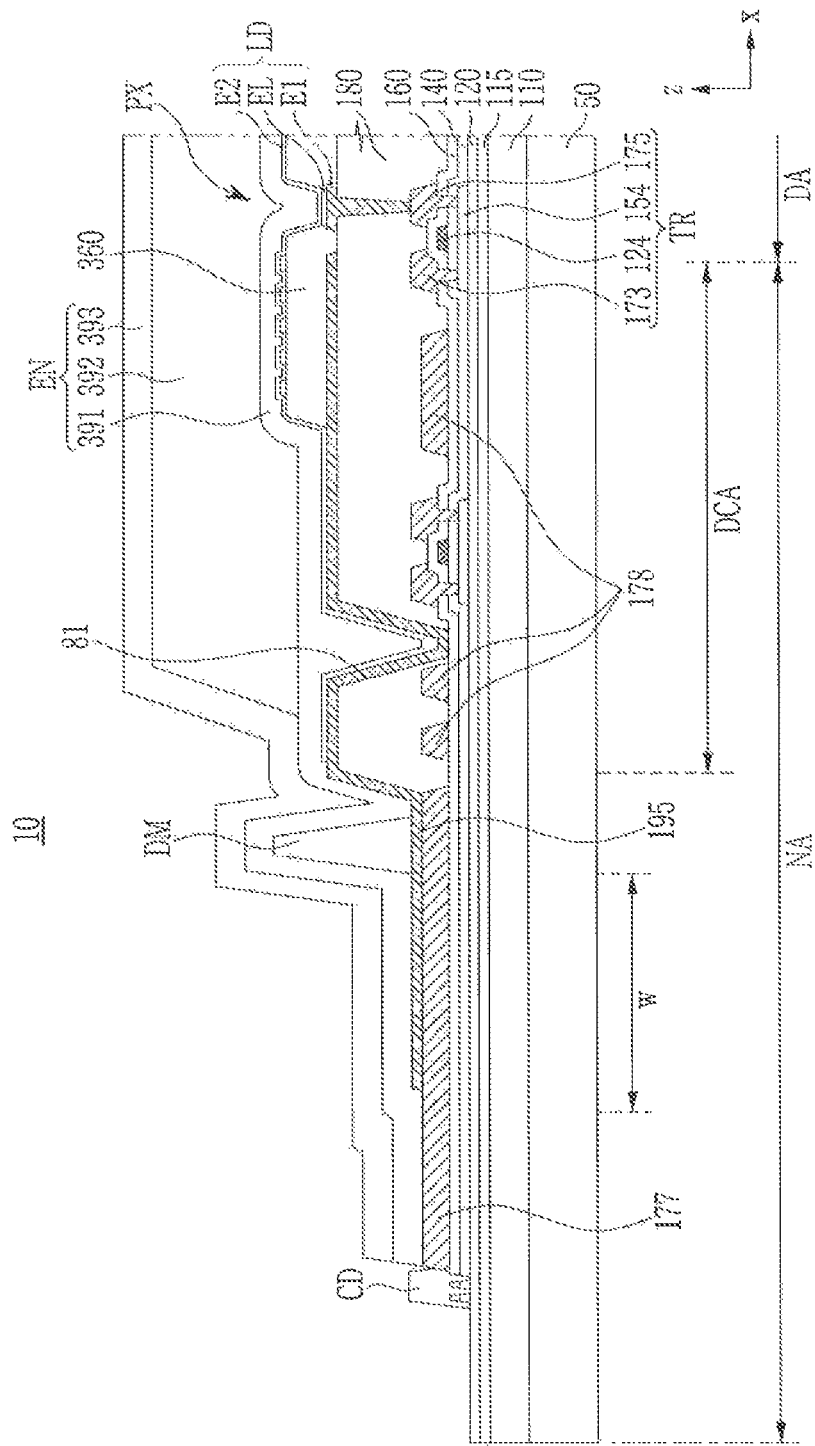
FIG. 4, FIG. 5, FIG. 6, FIG. 7, and FIG. 8 are schematic cross-sectional views taken along the line A-A' of FIG. 1 according to exemplary embodiments of the present inventive concepts.

Referring to FIG. 4, the encapsulation layer EN may be formed such that edges of the first inorganic layer 391 and the second inorganic layer 393 in the non-display area NA are substantially aligned with and coincide with the edge of the power line 177. As the widths of the first inorganic layer 391 and the second inorganic layer 393 increase, a moisture permeation preventing ability of the encapsulation layer EN may be increased. However, since regions where the first inorganic layer 391 and the second inorganic layer 393 are formed are within the region where the power line 177 is formed, the non-display area NA does not need to be increased to have sufficient space for the encapsulation layer EN.

Figure 5:
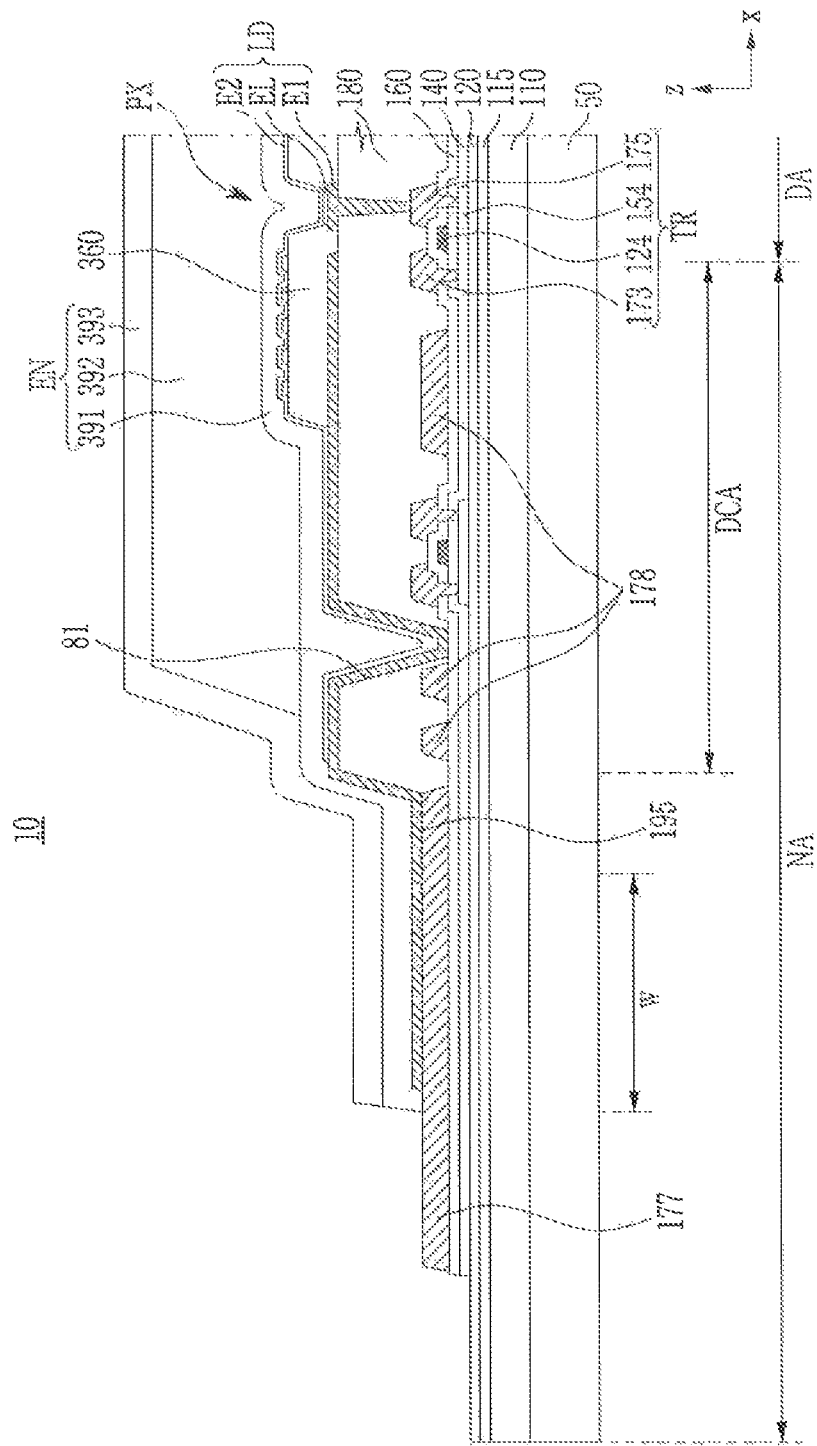
Figure 6:
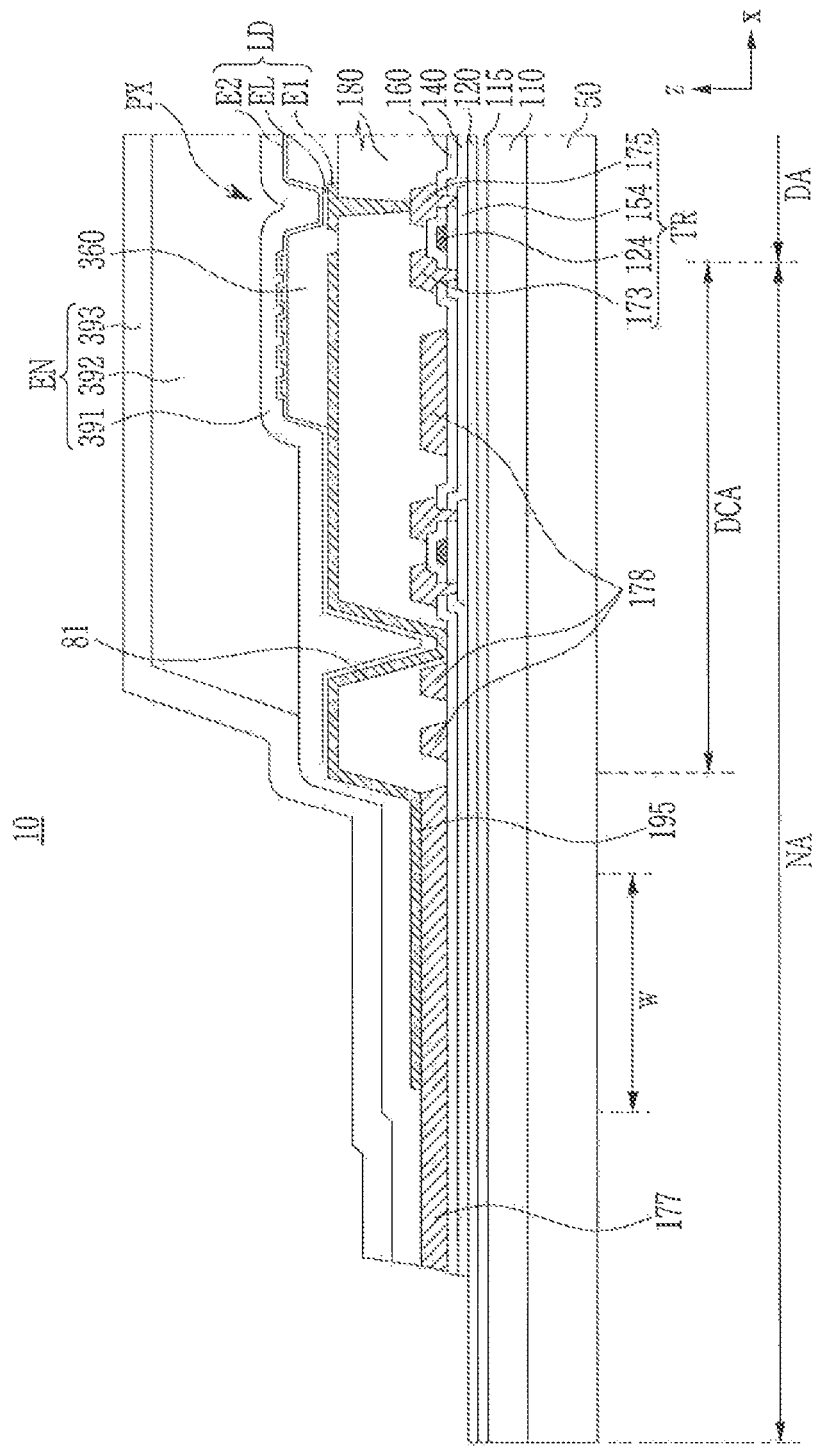

The embodiment of FIG. 5 and the embodiment of FIG. 6 differ from the embodiment of FIG. 2 and the embodiment of FIG. 4 in that the display panel 10 does not include the dam DM and the crack dam CD. As the manufacturing process of the display panel 10 is more precisely controlled, it may be possible to prevent overflow of the forming material of the organic layer 392 of the encapsulation layer EN or cracks from occurring during the cutting of the display panel 10 even when the dam DM and the crack dam CD are not formed. Therefore, unlike the exemplary embodiments shown in FIGS. 1-4, either the dam DM or the crack dam CD may not be included in other exemplary embodiments.

Figure 7:
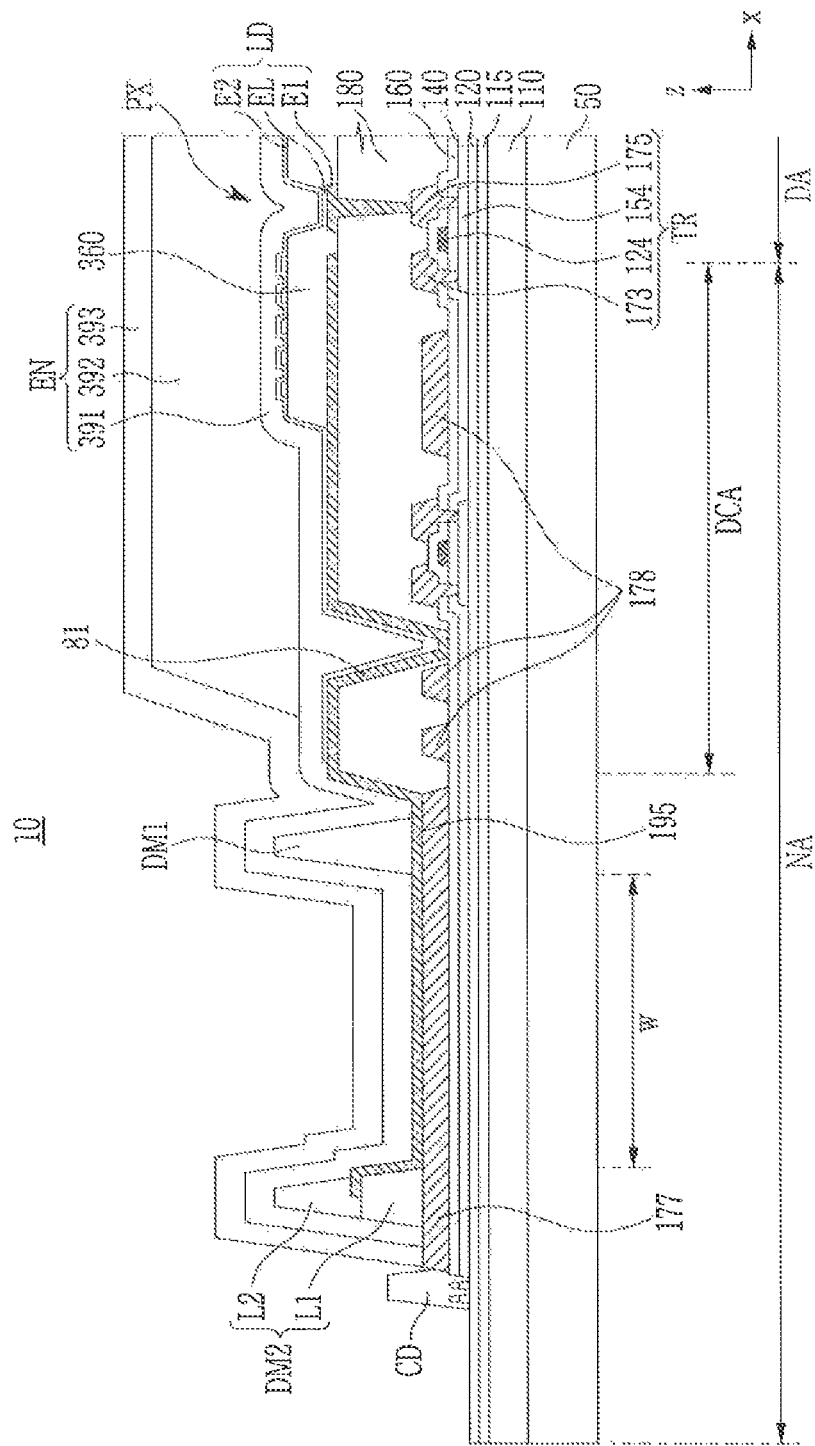

Referring to FIG. 7, two dams DM1 and DM2 may be located above the power line 177 in the non-display area DA. The first dam DM1 may be disposed closer to the display area DA than the second dam DM. The first dam DM1 may be formed as at least one layer.

In an exemplary embodiment, the first dam DM1 may be formed of a same material in a same process as those of the fourth insulating layer 360. A lower surface of the first dam DM1 may contact the connecting member 195. The second dam DM2 may include a plurality of layers.

The second dam DM2 may include a first layer L1 and a second layer L2 disposed thereon. A connecting member 195 may be disposed between the first layer L1 and the second layer L2. In an exemplary embodiment, the first layer L1 may be formed of a same material and by a same process as the third insulating layer 180. A lower layer of the first layer L1 may be in contact with the power line 177. In an exemplary embodiment, the second layer L2 may be formed of a same material and by a same process as the fourth insulating layer 360. Accordingly, the first dam DM1, the second layer L2 of the second dam DM2, and the fourth insulating layer 360 may be formed by stacking and patterning organic insulating materials.

In an exemplary embodiment, the first dam DM1 may be formed of a different material from that of the second layer L2 of the second dam DM2, or may be formed by another process. The first dam DM1 may include a plurality of layers, and the second dam DM2 may include a single layer.

The first inorganic layer 391 and the second inorganic layer 393 of the encapsulation layer EN may be formed to extend over the first dam DM1 and the second dam DM2. The edges of the first inorganic layer 391 and the second inorganic layer 393 may substantially coincide with an outer edge of the power line 177. As such, it is possible to more effectively prevent the overflow of the formation material of the organic layer 392 of the encapsulation layer EN by forming the first and second dams DM1 and DM2 and the first and second inorganic layers 391 and 393. In addition, a contact area between the first inorganic layer 391 and the second inorganic layer 393 may be increased to increase adhesion between the first inorganic layer 391 and the second inorganic layer 393, thereby increasing the moisture permeation preventing ability of the encapsulation layer EN. However, since the first and second dams DM1 and DM2 and the first and second inorganic layers 391 and 393 are formed within the formation region of the power line 177, the non-display area NA is not increased by the first and second dams DM1 and DM2, and the first and second inorganic layers 391 and 393. Alternatively, the width of the power line 177 may be increased instead of reducing the width of the non-display area NA, and in this case, the resistance of the power line 177 may be reduced to improve the power efficiency.

Figure 8:
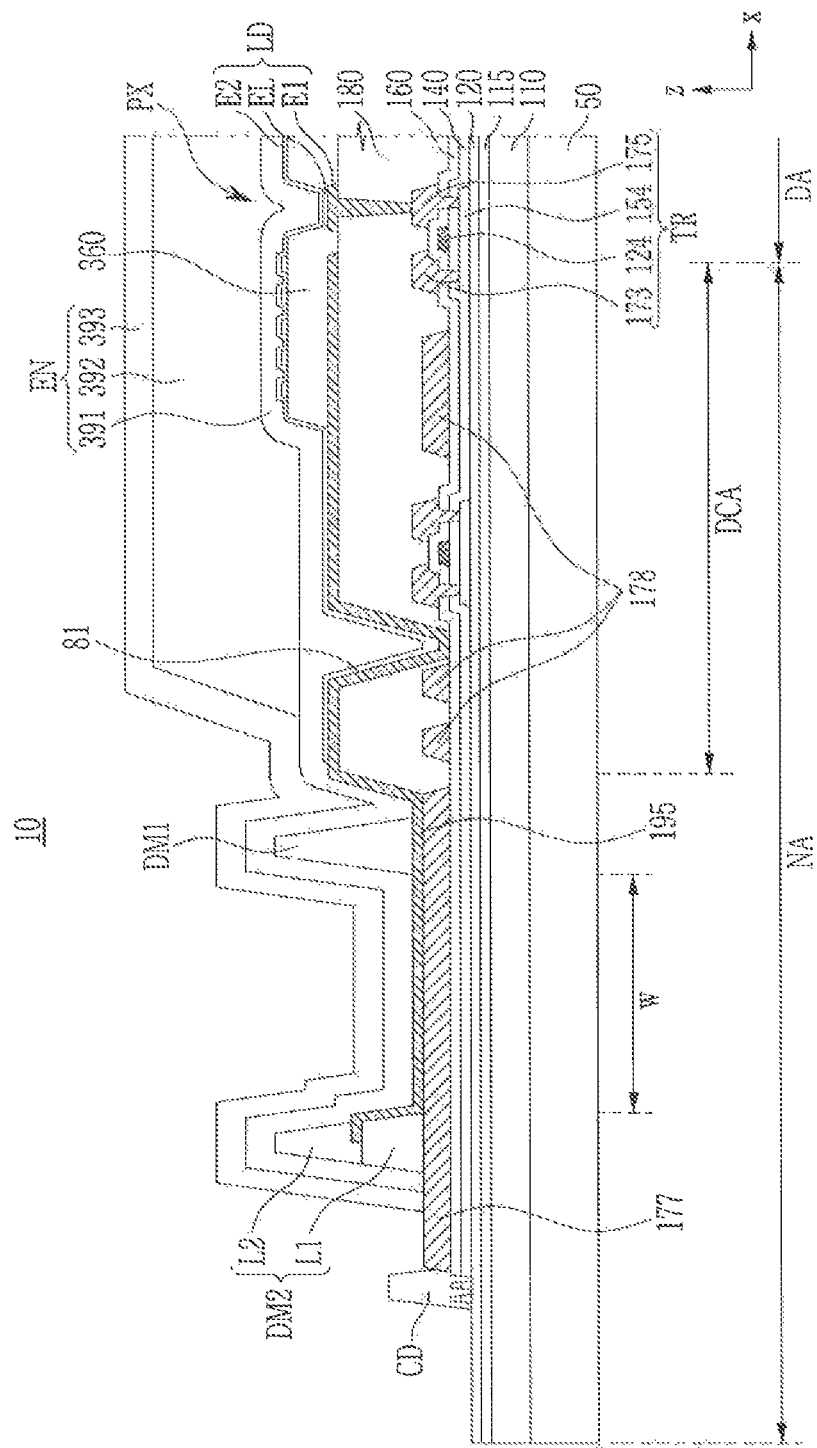

The exemplary embodiment shown in FIG. 8 is different from the embodiment of FIG. 7 in that the second dam DM2 is disposed closer to the first dam DM1, and the edges of the first inorganic layer 391 and the second inorganic layer 393 in the non-display area NA are disposed closer to the display area DA than the outer edge of the power line 177. It was determined that the moisture permeation may still be effectively prevented even when the first and second inorganic layers 391 and 393 are formed as described above, if the width w of the first inorganic layer 391 which contacts the power line 177 or the connecting member 195 is equal to or greater than a predetermined value.

While inventive concepts have been described in connection with what is presently considered to be practical exemplary embodiments, it is to be understood that the inventive concepts are not limited to the disclosed exemplary embodiments, but, on the contrary, is intended to cover various modifications and equivalent arrangements included within the spirit and scope of the appended claims.

What is claimed is:

1. A display device comprising:
a substrate including a display area and a non-display area;
a light emitting element disposed in the display area;
an encapsulation layer configured to cover the display area and encapsulate the light emitting element; and
a power line disposed in the non-display area,
wherein, a first edge of the encapsulation layer in the non-display area is disposed to coincide with an edge of the power line or is disposed closer to the display area than the edge of the power line, and
wherein, the first edge directly contacts the power line in the non-display area.

2. The display device of claim 1, wherein
the encapsulation layer includes a first inorganic layer, a second inorganic layer, and an organic layer disposed between the first inorganic layer and the second inorganic layer, and
the first edge of the encapsulation layer corresponds to edges of the first inorganic layer and the second inorganic layer.

3. The display device of claim 2, wherein
the first inorganic layer and the second inorganic layer contact each other in a region where the encapsulation layer overlaps the power line.

4. The display device of claim 2, further comprising
a connecting member connected with the power line, and
the first inorganic layer is configured to contact at least one of the power line and the connecting member.

5. The display device of claim 4, wherein
the light emitting element includes a first electrode, a second electrode, and an emission layer disposed between the first electrode and the second electrode, and
the connecting member is configured to electrically connect the second electrode to the power line.

6. The display device of claim 1, further comprising
at least one dam disposed in the non-display area,
wherein the dam is configured to overlap the power line and is covered by a first inorganic layer and a second inorganic layer.

7. The display device of claim 6, wherein
the dam is configured to contact the power line or a connecting member that is connected with the power line.

8. The display device of claim 1, further comprising
a crack dam disposed between an edge of the substrate in the non-display area and the power line.

9. The display device of claim 8, wherein
the crack dam covers at least a portion of a side surface of the power line.

10. The display device of claim 1, wherein
the power line is configured to transfer a common voltage.

11. A display device comprising:
a substrate including a display area and a non-display area;
a light emitting element disposed in the display area and including a first electrode, a second electrode, and an emission layer between the first electrode and the second electrode;
an encapsulation layer configured to cover the display area and to encapsulate the light emitting element, the encapsulation layer including a first edge being disposed in the non-display area;
a power line disposed in the non-display area; and
a connecting member configured to electrically connect the power line and the second electrode,
wherein the first edge directly contacts the power line in a region where the encapsulation layer overlaps the power line.

12. The display device of claim 11, wherein
the encapsulation layer includes a first inorganic layer, a second inorganic layer, and an organic layer disposed between the first inorganic layer and the second inorganic layer, and
the first edge of the encapsulation layer corresponds to edges of the first inorganic layer and the second inorganic layer.

13. The display device of claim 12, wherein
the first inorganic layer and the second inorganic layer contact each other in the region where the encapsulation layer overlaps the power line.

14. The display device of claim 12, wherein
the first inorganic layer contacts at least one of the power line and the connecting member.

15. The display device of claim 14, wherein
the connecting member is formed of a same material on a same layer as the first electrode.

16. The display device of claim 11, further comprising
at least one dam configured to surround an edge of the display area,
wherein the dam is configured to overlap the power line and is covered by a first inorganic layer and a second inorganic layer.

17. The display device of claim 16, wherein
the dam is configured to contact the power line or the connecting member.

18. The display device of claim 11, further comprising
a crack dam disposed between an edge of the substrate in the non-display area and the power line.

19. The display device of claim 18, wherein
the crack dam covers at least a portion of a side surface of the power line.

20. The display device of claim 11, wherein
the power line is configured to transfer a common voltage.

* * * * *